United States Patent [19]

Ohnuki et al.

[11] Patent Number: 5,130,681
[45] Date of Patent: Jul. 14, 1992

[54] SAW FILTER AND MOBILE TELEPHONE USING SAME

[75] Inventors: Hideo Ohnuki; Norio Hosaka; Hitoshi Watanabe; Jun Yamada, all of Kanagawa, Japan

[73] Assignee: Hitachi, Ltd., Tokyo, Japan

[21] Appl. No.: 533,420

[22] Filed: Jun. 5, 1990

[30] Foreign Application Priority Data

Jun. 5, 1989 [JP] Japan .................. 1-141014

[51] Int. Cl.$^5$ ............................................. H03H 9/64
[52] U.S. Cl. .................... 333/194; 333/196; 333/133; 310/313 B
[58] Field of Search ............ 333/154, 193–196, 333/133; 310/313 R, 313 B, 313 C, 313 D

[56] References Cited

U.S. PATENT DOCUMENTS

| | | | |
|---|---|---|---|
| 3,845,419 | 10/1974 | Nudd | 310/313 B X |
| 4,492,940 | 1/1985 | Hikita | 333/194 |
| 4,649,357 | 3/1987 | Nagai et al. | 333/196 |
| 4,939,487 | 7/1990 | Yuhara et al. | 333/193 |

FOREIGN PATENT DOCUMENTS

| | | | |
|---|---|---|---|
| 0010946 | 1/1978 | Japan | 333/193 |
| 0070813 | 4/1986 | Japan | 333/133 |
| 0082114 | 4/1988 | Japan | 333/193 |
| 0082706 | 3/1989 | Japan | 333/195 |

*Primary Examiner*—Eugene R. LaRoche
*Assistant Examiner*—Seung Ham
*Attorney, Agent, or Firm*—Antonelli, Terry, Stout & Kraus

[57] ABSTRACT

A plurality of interdigital transducers (IDTs) of a surface acoustic wave bandpass filter, each of which has a plurality of electrode fingers arranged in a direction perpendicular to a propagating direction of surface acoustic wave, are connected alternatively to an input terminal and an output terminal of said filter. The IDTs are different in number of electrode fingers and in average value of inter-finger distance from each other and distance between adjacent IDTs are different. At least one of the outermost IDTs has a minimum number of electrode fingers and a maximum average value of inter-finger distance, compared with those of other IDTs.

4 Claims, 3 Drawing Sheets

SAW FILTER AND MOBILE TELEPHONE USING SAME

BACKGROUND OF THE INVENTION

The present invention relates to a compact, low-insertion loss surface acoustic wave (SAW) filter having a desired frequency characteristics and a portable telephone utilizing the same.

There are a number of SAW filters having acceptable frequency characteristics proposed in the past. For example, in Japanese Patent Application Laid-Open (Kokai) No. 154917/1983, discloses a method of realizing a low-insertion loss filter in connection with a number of interdigital transducers (IDTs) arranged in parallel to a propagating direction of surface acoustic wave, i.e. a direction perpendicular to electrode fingers thereof, and connected alternately to an input terminal and an output terminal of the filter, in which the number of electrode fingers forming the interdigital transducers in a center portion thereof is greater than those of electrode fingers of the opposite side portions thereof so that the number of interdigital transducers is reduced.

An article "SAW Filters Employing Interdigitated Interdigital Transducers, IIDT", M. Lewis, 1982 ULTRASONIC SYMPOSIUM, pages 12 to 17, IEEE discloses similar filters which realize easy fabrication and low insertion loss. Another article, "LOW LOSS SAW FILTER FOR ANTENNA DUPLEXER", M. Hikita, et al, 1983, ULTRASONIC SYMPOSIUM, pages 77 to 86, IEEE discloses a filter similar thereto which is effectively applied to a portable telephone.

Although the filters disclosed in these articles are superior in simplicity of the related structure and in low insertion loss compared with conventional filters in which two or three IDTs are used, reduction of loss and flatness of frequency characteristics are not always enough.

An object of the present invention is to provide a compact, low insertion loss surface acoustic wave filter having sufficiently flat frequency characteristics to thereby solve the problems of the prior art.

Another object of the present invention is to provide a portable telephone which utilizes the compact, low insertion loss surface acoustic wave filter as a duplexer or as a bandpass filter in a first stage of the telephone.

SUMMARY OF THE INVENTION

In order to achieve the above objects, according to the present invention, a surface acoustic wave filter has a plurality of IDTs arranged in a direction perpendicular to electrode fingers thereof and connected alternately to an input terminal and an output terminal of the filter, in which the IDTs are different in the number of electrode fingers corresponding thereto, are different in the average value of inter-finger distances thereof and have different inter-transducer distances between different ones of adjacently disposed IDTs. Also, at least one of the outermost positioned IDTs has a minimum number of electrode fingers and a maximum average value of interfinger distance compared with those of other IDTs. The term "inter-finger distance" used herein means a distance between adjacent electrode fingers of an IDT and the term "intertransducer distance" means a distance between adjacent IDTs.

By making inter-finger distance and intertransducer distance of each of IDTs constituting a filter different from each other, it is possible to control the phase of a surface acoustic wave transmitted/received by the respective IDTs. With such a construction, it is possible to devise a bandpass filter having low insertion loss and flat frequency characteristics over its pass-band width while using a smaller number of IDTs compared with the conventional case where only the amplitude characteristic of the surface acoustic wave can be controlled.

Particularly, by making the number of electrode fingers of at least one of the outermost IDTs smaller compared with those of other IDTs, it is possible to minimize surface acoustic wave energy radiated from the outermost IDT and to broaden the pass-band and, by making the average value of inter-finger distance thereof maximum, it is possible to efficiently reflect the surface acoustic wave radiated from other IDTs.

Further, since the phase of the propagating surface acoustic wave is controlled by making the inter-transducer distance of the respective different IDTs, the phase of an electric signal converted by those on the output side is also differed and thus, when all of electric signals from the output side IDTs are synthesized, the frequency characteristics can be flattened over the pass-band.

DETAILED DESCRIPTION OF THE PREFERRED EMBODIMENTS

Figure 1:
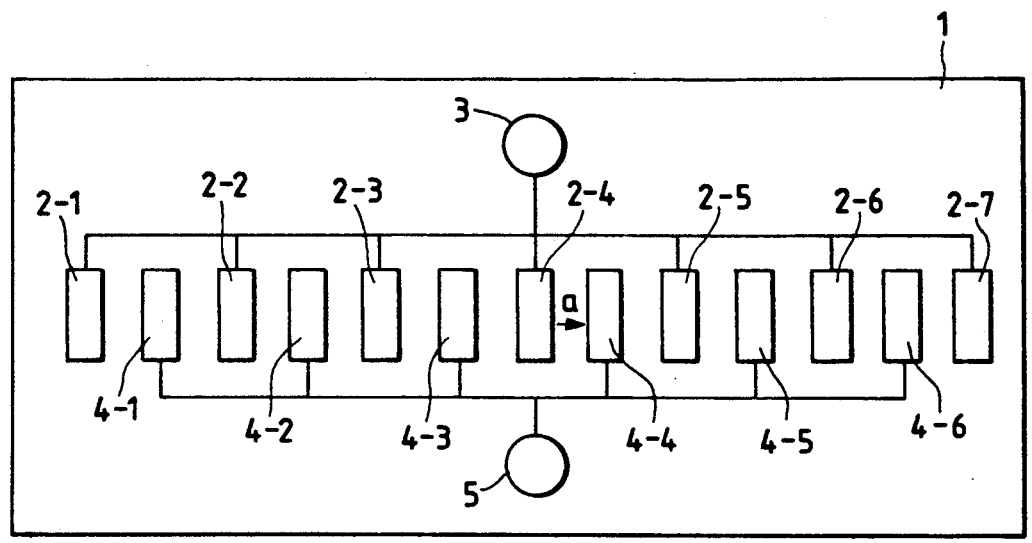
FIG. 1 shows a first embodiment filter of the present invention, schematically.

FIG. 1 shows a SAW filter according to a first embodiment of the present invention, schematically. In this embodiment, a 36° Y-cut lithium tantalate substrate 1 is used as a piezo-electric converter, on which an aluminum film of about 1000 Å thick is formed. By using known photolithographic technology, the aluminum film is etched to form input side IDTs 2-1, 2-2, 2-3, 2-4, 2-5, 2-6 and 2-7 which are commonly connected to an input terminal 3 of the filter and output side IDTs 4-1, 4-2, 4-3, 4-4, 4-5 and 4-6 which are connected to an output terminal 5 of the filter commonly.

Figure 2:
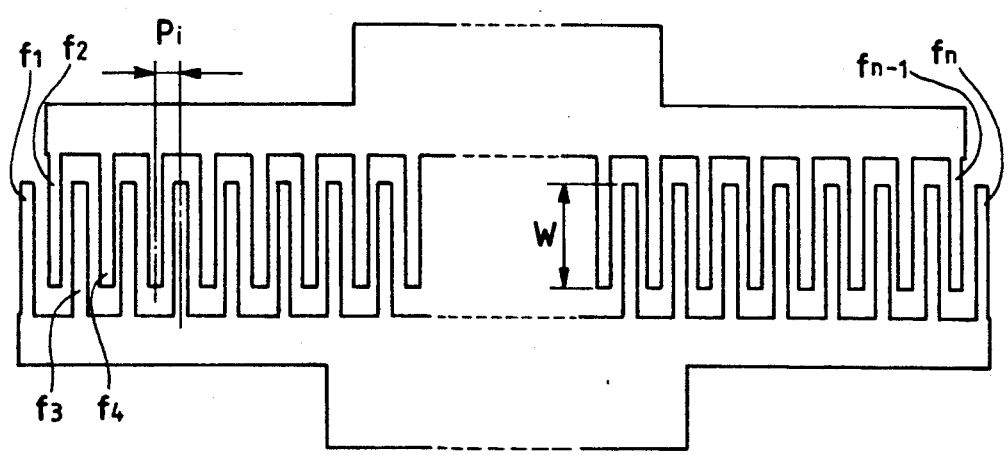
FIG. 2 shows a construction of each of interdigital transducers used in the first embodiment shown in FIG. 1.

Each of the IDTs is constituted as shown in FIG. 2. In FIG. 2, an upper transducer portion of the IDT, for example, is connected to either the input terminal 3 or the output terminal 5 of the filter, as mentioned above, and a lower transducer portion is grounded (not shown in FIG. 1). The number of electrode fingers f1 to fn of the IDT shown in FIG. 2 is u and an inter-finger distance between a finger of the upper transducer and a finger of the lower transducer adjacent thereto is depicted by Pi in FIG. 2.

For the IDT shown in FIG. 2, there is no weighting of fingers which is used commonly for improving the frequency characteristics of the filter. However, it may be possible to weight them by changing the width W of an overlapping portion of electrode fingers of the upper and the lower electrodes or by removing specific electrode finger or fingers thereof, if necessary.

An average value of inter-finger distance in the case of a selective removal of electrode fingers can be calculated by taking the number of removed electrode fingers into consideration.

Table 1 shows an example of the number of electrode fingers and the inter-finger distance of the filter shown in FIGS. 1 and 2, which is obtained by calculation of an equivalent circuit model selected according to the principle of the present invention as those providing desirable results.

Table 2 shows an example of the inter-transducer distances which provide flat frequency characteristics over the pass-band.

In the embodiment shown in FIGS. 1 and 2, the input side IDTs 2-1 and 2-7, 2-2 and 2-6 and 2-3 and 2-5 are identical in construction and the output side IDTs 4-1 and 4-6, 4-2 and 4-5 and 4-3 and 4-4 are identical in construction.

TABLE 1

| electrode | no. of fingers | averange value of inter-finger |
|---|---|---|
| 2-1, 2-7 | 35 | 2.35 μm |
| 2-2, 2-6 | 49 | 2.34 μm |
| 2-3, 2-5 | 47 | 2.34 μm |
| 2-4 | 53 | 2.33 μm |
| 4-1, 4-6 | 57 | 2.31 μm |
| 4-2, 4-5 | 45 | 2.33 μm |
| 4-3, 4-4 | 49 | 2.32 μm |

TABLE 2

| inter-transducer position | distance (μm) |
|---|---|
| 2-1 to 4-1: 4-6 to 2-7 | 67.7 |
| 4-1 to 2-2: 2-6 to 4-6 | 63.0 |
| 2-2 to 4-2: 4-5 to 2-6 | 58.4 |
| 4-2 to 2-3: 2-5 to 4-5 | 58.5 |
| 2-3 to 4-3: 4-4 to 2-5 | 63.2 |
| 4-3 to 2-4: 2-4 to 4-4 | 67.6 |

The number of electrode fingers of each of the outermost IDTs 2-1 and 2-7 is smallest and the average value of inter-finger distance thereof is largest compared with that of other IDTs.

With the construction mentioned above, an electric signal supplied to the input terminal 3 is branched to the IDTs 2-1 to 2-7 and converted into surface acoustic wave, respectively. Since in this embodiment the input side IDTs 2-1 to 2-7 are respectively different in the number of electrode fingers corresponding thereto and in the average inter-finger distance from each other, the amplitude and phase of surface acoustic waves converted by the respective IDTs are also different from each other.

These surface acoustic waves propagate along the substrate 1 toward the output side IDTs 4-1 to 4-6, respectively. For example, surface acoustic wave a in FIG. 1 emitted by the input side IDT 2-4 propagates along the substrate 1 and reaches the output side IDT 4-4. During this propagation, phase rotation occurs in the wave a depending upon a propagation distance. A portion of surface acoustic wave a arrived at the output side IDT 4-4 is converted into an electric signal and another portion thereof is reflected by this transducer, the remaining portion propagating therethrough. Since this is the same for any other IDT, the output side IDT 4-4, for example, receives surface acoustic waves having various amplitudes and various phases which are converted into electric signals. Such electric signals from the respective output side IDTs 4-1 to 4-6 are combined at the output terminal 5.

Figure 3:
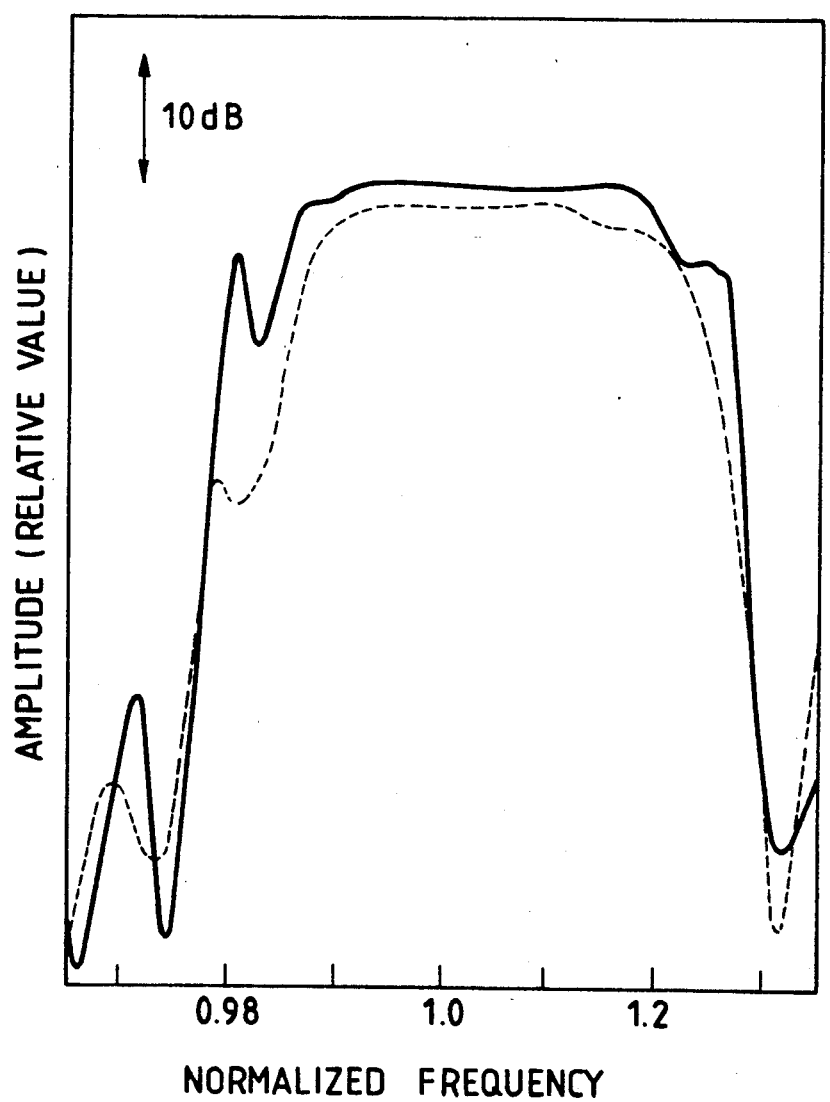
FIG. 3 shows comparative frequency characteristics of the first embodiment and a conventional filter.

FIG. 3 shows by a solid line the frequency characteristics of the filter according to the first embodiment shown in FIG. 1. Frequency characteristics of a filter constructed according to the conventional technique with the same number of comb electrodes is also shown in FIG. 3 by a dotted line for comparison purpose.

From FIG. 3, it is clear that the filter according to the embodiment shown in FIG. 1 is advantageous in insertion loss and flatness of frequency characteristics over the conventional filter. Further, although, according to the conventional technique, it is possible to reduce insertion loss by increasing the number of IDTs, it results in an increase of size of the filter. Therefore, this embodiment is compact since there is no need of increasing the IDTs.

As described hereinbefore, according to the present invention in which amplitude and phase of electric signals are changed when the electric signal is converted into surface acoustic wave, when the resultant surface acoustic wave propagates along the substrate and when it is converted into electric signal, it is possible to obtain sufficiently flat frequency characteristics of the filter as a whole.

Further, since numerical values of the outermost IDTs 2-1 and 2-7 are set as shown in Table 1, these outermost transducers provide surface acoustic waves having small amplitude and effectively reflect surface acoustic waves emitted by other IDTs. Therefore, it is possible to obtain a compact and low insertion loss filter.

In the first embodiment shown in FIG. 1, the IDTs are arranged symmetrically about the IDT 2-4. However, such symmetrical structure is not always necessary and the number of electrode fingers and inter-finger distance of all IDTs can be made different from each other. In such a case, it is preferable to make the number of electrode fingers of one of the outermost IDTs smallest and the average value of inter-finger distance thereof largest.

Further, although, in the first embodiment, the number of the input side IDTs is 7 and that of the output side IDTs is 6 (referred to as 7:6), any other construction such as 8:7, 9:8, 6:7, 7:8 or 8:9, can be used with the same effect.

Figure 4:
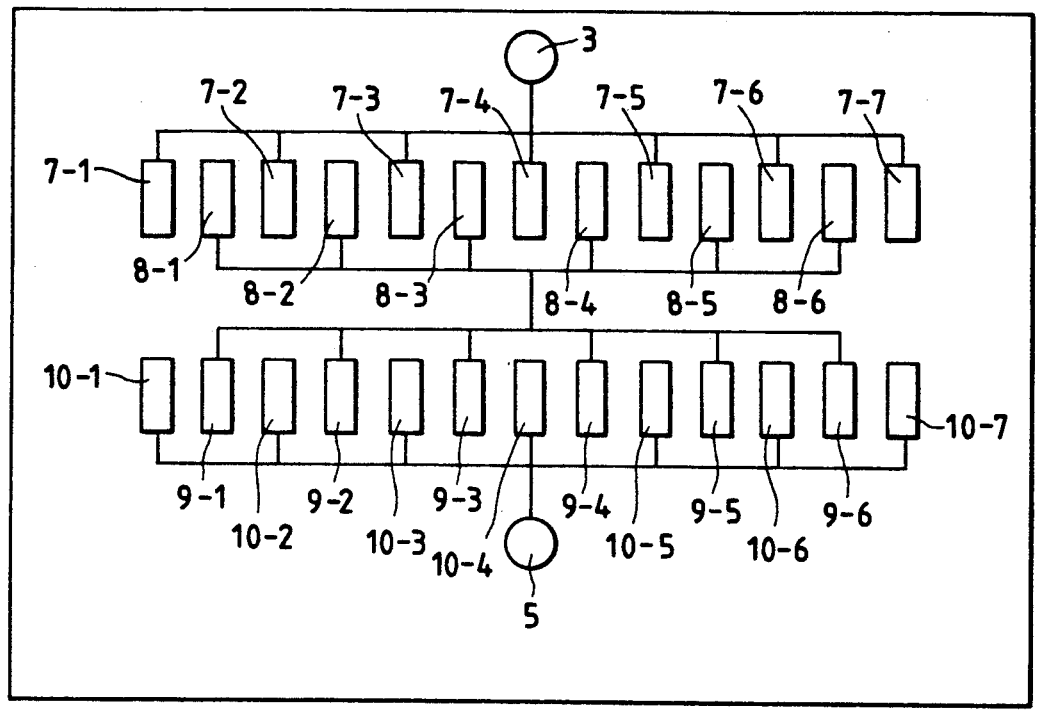
FIG. 4 shows a second embodiment of the present invention.

FIG. 4 shows a second embodiment of the present invention. In this embodiment, a pair of IDTs arrangements each similar to that shown in FIG. 1 are connected in series. Input side IDTs 7-1, 7-2, 7-3, 7-4, 7-5, 7-6 and 7-7 and intermediate IDTs 8-1, 8-2, 8-3, 8-4, 8-5 and 8-6 which correspond to the structure shown in FIG. 1 are arranged in a row and intermediate IDTs 9-1, 9-2, 9-3, 9-4, 9-5 and 9-6 and output side IDTs 10-1, 10-2, 10-3, 10-4, 10-5, 10-6 and 10-7 are also arranged in another row. The input side IDTs 7-1 to 7-7 are electrically connected to each other and to an input terminal 3. The intermediate IDTs 8-1 to 8-6 in the first row and the intermediate IDTs 9-1 to 9-6 in the second row are connected electrically in series with each other. The output side IDTs 10-1 to 10-7 are connected to each other and to an output terminal 5 electrically.

The numbers of electrode fingers of the outermost IDTs 7-1 and 7-7 in the first row are smallest and average values of inter-finger distance thereof are largest compared with those of other IDTs in the same row. This is also the same for the IDTs in the second row. With such construction, frequency characteristics can be improved in transmitting energy from the first row to the second row. frequency characteristics can be improved in transmitting intermediate IDTs are electrically connected in series through a junction it is possible to connect, for example, the intermediate IDT 8-1 in the first row directly to the intermediate IDT 9-1 in the second row, and similarly connect 8-2 to 9-2, 8-3 to 9-3, 8-4 to 9-4, 8-5 to 9-5 and 8-6 to 9-6. In such case, the freedom of design is further increased, resulting in a more precise design.

Figure 5:
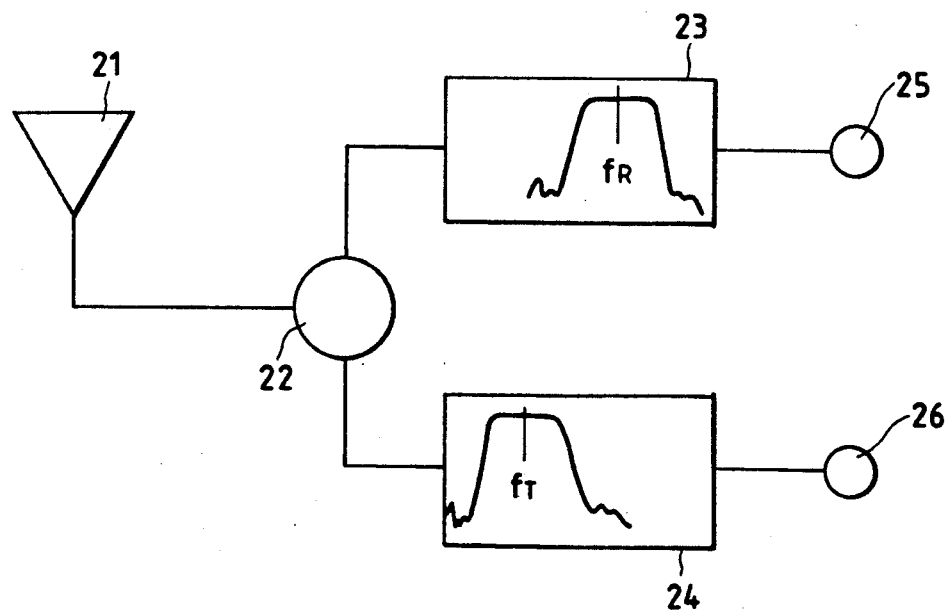
FIG. 5 shows a third embodiment in which the present filter is applied to a portable telephone system.

FIG. 5 shows a third embodiment of the present invention in which the filter according to the present invention is applied to a portable telephone system.

In FIG. 5, an antenna 21 is connected to a separator 22. The separator 22 has two output terminals one of which is connected to an input of a surface acoustic wave bandpass filter 23 constructed according to either the first or second embodiment of the present invention. The filter 23 has a center frequency $f_R$ and an output terminal thereof is connected to a receiving terminal 25 of the telephone. To the other terminal of the separator 22, a surface acoustic wave bandpass filter 24 constructed according to either the first or second embodiment of the present invention, having a center frequency $f_T$ and connected to a transmitting terminal 26 is connected. The separator 22 comprises an isolator or a circulator and is used to separate transmitting direction of signal between receiving and transmission.

A signal received by the antenna 21 is directed by the separator 22 to the surface acoustic wave band-pass filter 23 so that only necessary band thereof is transmitted through the filter 23 to the receiving terminal 25. A transmitting signal is supplied from the transmitting terminal 26 and transmitted through the surface acoustic wave band-pass filter 24 to the separator 22 and, then transmitted from the antenna 21.

The surface acoustic wave bandpass filter according to the present invention is compact in size and of low insertion loss. Therefore, by using it as a bandpass filter in a first stage on the antenna side of the portable telephone system, degradation of receiving sensitivity of the system is minimized. Further, since attenuation of transmission power is small, a smaller battery can be used. Since the size of the surface acoustic wave bandpass filter itself is small, it is possible to make the portable telephone system smaller.

Although, in this embodiment, the separator 22 is used, it may be omitted depending upon a system specification. In such case, the surface acoustic wave bandpass filters 23 and 24 may act as branch devices.

As described, according to the present invention, since amplitude and phase of electric signals are changed when the electric signal is converted into surface acoustic wave, when the latter propagates along the substrate and when it is converted into electric signal, it is possible to obtain a flat frequency characteristics. Further, since the number of electrode fingers of at least one of the outermost IDTs is smallest and the average value of inter-finger distance thereof is largest compared with other IDTs, it is possible to reduce insertion loss with a relatively small number of electrode fingers. Further, since the number of IDTs to be used is small, it is possible to make it compact. Further, since the present surface acoustic wave bandpass filter is compact and of low insertion loss, it is possible to obtain a compact portable telephone system having high receiving sensitivity when the present filter is applied thereto.

What is claimed is:

1. A surface acoustic wave bandpass filter comprising a plurality of interdigital transducers (IDTs) arranged in a propagating direction of surface acoustic waves and connected alternately to an input terminal and an output terminal of said filter, wherein each one of said plurality of IDTs includes a plurality of electrode fingers extending perpendicularly to the propagating direction of a surface acoustic wave thereof, wherein said plurality of IDTs respectively have different numbers of electrode fingers and different average values of inter-finger distances from each other in accordance with the relative positioning of said IDTs, wherein said plurality of IDTs are disposed to provide different inter-transducer distances between different ones of adjacently disposed IDTs, and wherein one of the outermost positioned IDTs has a minimum number of electrode fingers and a maximum average value of inter-electrode finger distance, with respect to other ones of said plurality of IDTs.

2. A surface acoustic wave bandpass filter comprising a pair of surface acoustic wave devices connected electrically in series, each of said pair of surface acoustic wave devices includes a plurality of interdigital transducers (IDTs) arranged in a propagating direction of surface acoustic waves and connected alternately to an input terminal and an output terminal of said filter, wherein each one of said plurality of IDTs includes a plurality of electrode fingers extending perpendicularly to the propagating direction of a surface acoustic wave thereof, wherein said plurality of IDTs respectively have different numbers of electrode fingers and different average values of inter-finger distances from each other in accordance with the relative positioning of said IDTs, wherein said plurality of IDTs are disposed to provide different inter-transducer distances between different one of adjacently disposed IDTs, and wherein at least one of the outermost positioned IDTs has a minimum number of electrode fingers and a maximum average value of inter-finger distances, with respect to other ones of said plurality of IDTs.

3. A portable telephone device comprising an antenna, a separator having a terminal connected to said antenna and two terminals, a pair of surface acoustic wave bandpass filters connected to said two terminals of said separator, respectively, wherein said surface acoustic wave bandpass filters have respectively different center frequencies and each comprises: a plurality of interdigital transducers (IDTs) arranged in a propagating direction of surface acoustic waves and connected alternately to an input terminal and an output terminal of said filter, wherein each one of said plurality of IDTs includes a plurality of electrode fingers extending perpendicularly to the propagating direction of a surface acoustic wave thereof, wherein said plurality of IDTs respectively have different numbers of electrode fingers and different average values of inter-finger distances from each other in accordance with the relative positioning of said IDTs, wherein said plurality of IDTs are disposed to provide different inter-transducer distances between different ones of adjacently disposed IDTs, and wherein one of the outermost positioned IDTs has a minimum number of electrode fingers and a maximum average value of inter-electrode finger distance, with respect to other ones of said plurality of IDTs.

4. A portable telephone device comprising an antenna, a separator having a terminal connected to said antenna and two terminals, a pair of surface acoustic wave bandpass filters connected to said two terminals of said separator, respectively, wherein said surface acoustic wave bandpass filters have respectively different center frequencies and each comprises: a pair of surface acoustic wave devices connected electrically in series, each of said pair of devices including a plurality of interdigital transducers (IDTs) arranged in a propagating direction of surface acoustic waves and connected alternately to an input terminal and an output terminal of said filter, wherein each one of said plurality of IDTs includes a plurality of electrode fingers extending perpendicularly to the propagating direction of a surface acoustic wave thereof, wherein said plurality of IDTs respectively have different numbers of electrode fingers and different average values of inter-finger distances from each other in accordance with the relative positioning of said IDTs, wherein said plurality of IDTs are disposed to provide different inter-transducer distances between different ones of adjacently disposed IDTs, and wherein one of the outermost positioned IDTs has a minimum number of electrode fingers and a maximum average value of inter-electrode finger distance, with respect to other ones of said plurality of IDTs.

* * * * *